(12) United States Patent
Earls

(10) Patent No.: US 7,873,486 B2
(45) Date of Patent: Jan. 18, 2011

(54) SPECTROGRAM MASK TRIGGER

(75) Inventor: Jeffrey D. Earls, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/903,418

(22) Filed: Jul. 29, 2004

(65) Prior Publication Data
US 2006/0025947 A1 Feb. 2, 2006

(51) Int. Cl.
*G01R 23/16* (2006.01)
(52) U.S. Cl. .................. 702/76; 702/67; 324/76.19
(58) Field of Classification Search ............ None
See application file for complete search history.

(56) References Cited

U.S. PATENT DOCUMENTS

| | | | |
|---|---|---|---|
| 4,843,562 A * | 6/1989 | Kenyon et al. | 702/73 |
| 4,870,348 A | 9/1989 | Smith et al. | |
| 5,574,639 A * | 11/1996 | Qian et al. | 708/300 |
| 5,574,665 A * | 11/1996 | Narasimhan | 702/75 |
| 6,115,407 A * | 9/2000 | Gendel et al. | 375/132 |
| 6,519,010 B2 * | 2/2003 | Twitchell et al. | 348/608 |
| 6,701,131 B2 * | 3/2004 | Kicklighter et al. | 455/67.11 |
| 2003/0224741 A1 * | 12/2003 | Sugar et al. | 455/115.1 |

FOREIGN PATENT DOCUMENTS

JP 0968551 3/1997

OTHER PUBLICATIONS

Shi, G. et al. "Robust Digit Recognition using Phase-Dependent Time-Frequency Masking", Jul. 6-9, 2003, 2003 IEEE Internation Conference on Multimedia and Expo, vol. 3, Baltimore, MD, USA, pp. 629-632.*
Hampton, J. et al. "A Frequency Hopping Sequential Detection Technique for In-Net Coare Acquisition", MILCOM '92—'Communications—Fusing Command, Control and Intelligence' Conference Record, San Diego, CA, USA Oct. 11-14, 1992, pp. 43-47 vol. 1.*
Tektronix-Japan Brochure of the RSA3300A/RSA2200A; Published Apr. 2004. (English translation attached).

* cited by examiner

Primary Examiner—Manuel L Barbee
(74) Attorney, Agent, or Firm—Francis I. Gray; Michael A. Nelson

(57) ABSTRACT

A spectrogram mask trigger is generated in response to multiple or complex frequency events within a signal being monitored. A sequence of frequency masks over a period of time is generated according to a frequency trajectory, frequency hops or other complex frequency events expected in the signal to form a spectrogram mask. The spectrogram mask is then applied to multiple spectra or spectrogram of the signal to determine whether an anomalous frequency event has occurred within the time period or to identify a particular frequency pattern within the signal. Depending upon the results of the spectrogram mask application, the spectrogram mask trigger is generated for storing a block of data from the signal surrounding the triggering event for further analysis.

8 Claims, 3 Drawing Sheets

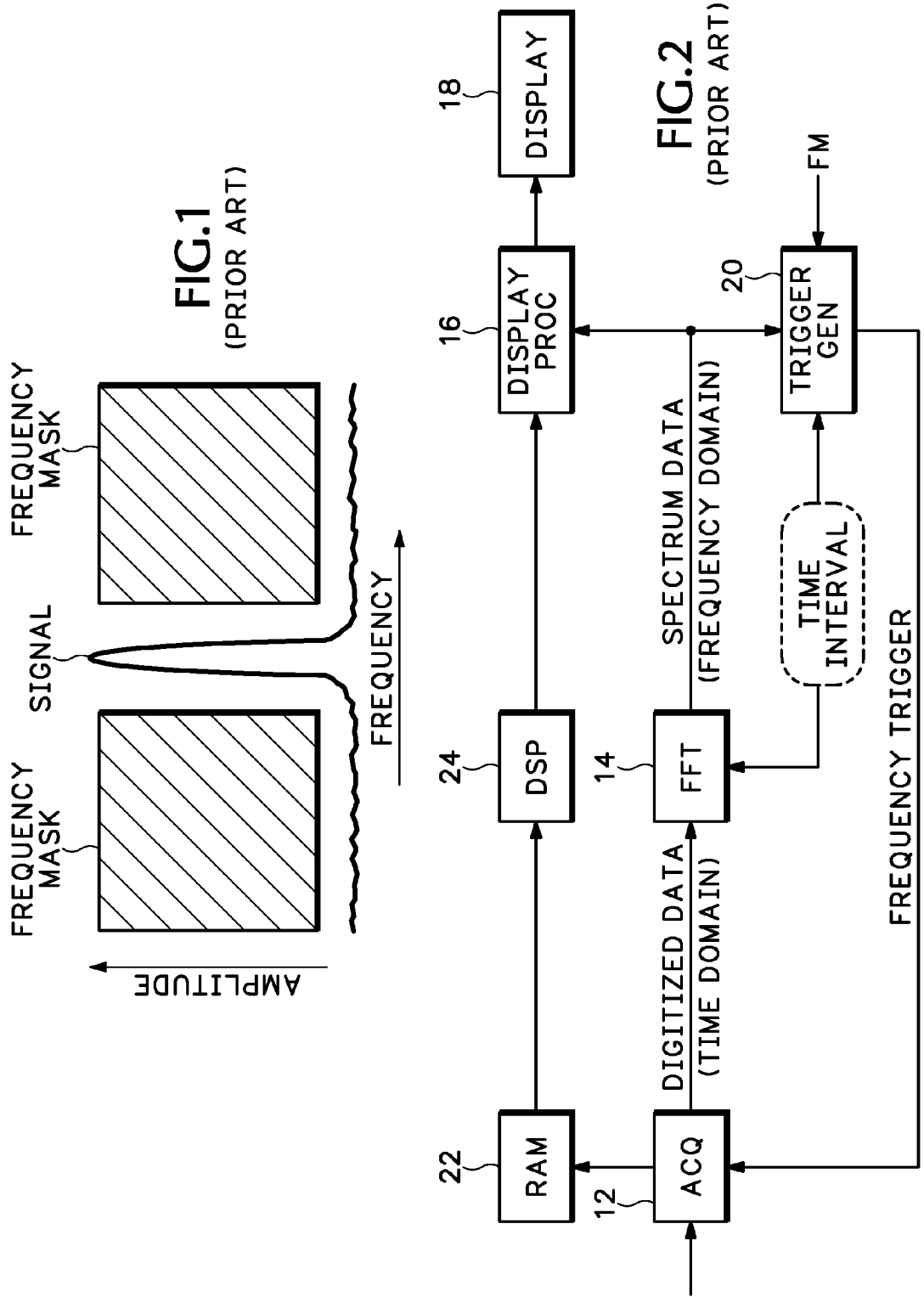

SPECTROGRAM MASK

SPECTROGRAM MASK TRIGGER

BACKGROUND OF THE INVENTION

The present invention relates to spectrum analzyers, and more particularly to spectrum analyzers with the capability of displaying spectrum information over time.

A display of spectrum information over time is often referred to as a "spectrogram." In a spectrogram frequency is along one axis and time is along another. Spectral amplitude is often denoted with color or with brightness gradations (grey scale). Several current spectrum analyzers on the market have a spectrogram display function including the Tektronix WCA200, WCA300, RSA2200 and RSA3300 series realtime spectrum analyzers. Such a spectrogram is also illustrated in FIG. 2 of U.S. Pat. No. 4,870,348. The above-referenced realtime spectrum analyzers capture seamless blocks of data for later analysis. Unlike conventional swept spectrum analyzers, no data within the blocks is missed or lost. One function that may be performed on this data is a function called a frequency mask trigger. In the case of the WCA200 this trigger is implemented with a dedicated fast Fourier transform (FFT) processor that works on the realtime data provided by its receiver system. When the user-defined frequency mask is violated, a predefined block of data is stored that includes information on what happened around the event that violated the frequency mask—data before the event being referred to as pre-trigger data and data after the event being referred to as post-trigger data. The frequency mask trigger works by comparing each spectrum the FFT processor calculates to a predefined mask. In this manner the spectrum analyzer waits for a specific single event to occur.

There are signals that occur where a carrier might be following an expected trajectory or have a particular sequence of frequency changes, such as is displayed by a hopping signal. A single event frequency mask is not able to provide a trigger that is a function of such complex events, but rather would provide inappropriate triggers as the carrier or hopping trigger changed frequencies.

What is desired is a frequency mask trigger that allows a spectrum analyzer to trigger on multiple or complex events.

BRIEF SUMMARY OF THE INVENTION

Accordingly the present invention provides a spectrogram mask trigger in response to multiple or complex frequency events within a signal being monitored. A sequence of frequency masks over a period of time are generated according to a frequency trajectory, frequency hops or other complex frequency events expected in the signal to form a spectrogram mask. The spectrogram mask is then applied to multiple spectra of the signal to determine whether an anomalous frequency event has occurred within the time period or to identify a particular frequency pattern within the signal. Depending upon the results of the spectrogram mask application, the spectrogram mask trigger is generated for storing a block of data from the signal surrounding the triggering event for further analysis.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a graphic view of a frequency mask for generating a trigger signal according to the prior art.

FIG. 2 is a basic block diagram of a realtime spectrum analyzer according to the prior art.

DETAILED DESCRIPTION OF THE INVENTION

Figure 3:
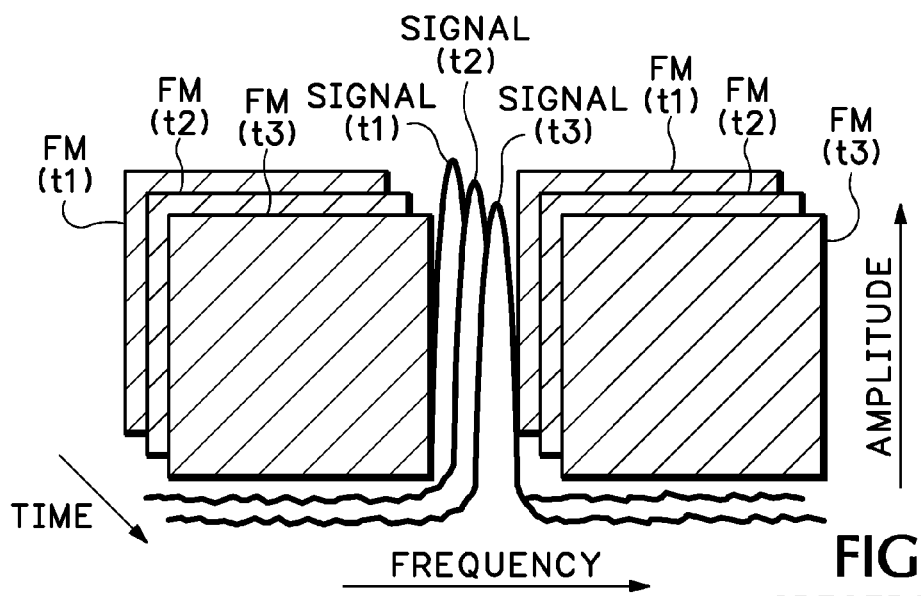
FIG. 3 is a graphic view of replicated frequency masks for generating a spectrogram mask trigger according to the present invention.

FIG. 1 is an example of a frequency mask applied to the spectrum of an input signal. As shown the frequency mask defines a region in the frequency domain, the amplitude and frequency boundaries of which define either a valid signal region or an invalid signal region. In this example the frequency mask, as indicated by the shaded areas, is in a form of two rectangles with a space between them that defines invalid signal regions in the frequency domain. If the carrier frequency of the signal drifts one way or the other too much, or if spurious sidebands or intermodulation signals occur about the carrier frequency, the resulting spectrum will have frequency components that intersect with the frequency mask regions to produce a frequency mask trigger signal.

As shown in FIG. 2 a signal of interest is input to an acquisition system 12 which preferably covers a large bandwidth. The acquisition system 12 produces a time domain representation of the signal in the form of a stream of digitized data. The digitized data is processed by a fast Fourier transform (FFT) module 14 to produce a frequency domain representation of the signal in the form of a spectrum for a specified time interval. Spectra of the signal over multiple time intervals are processed by a display processor 16 for presentation on an appropriate display device 18 in the form of a spectrogram, as described in the above-mentioned U.S. Pat. No. 4,870,348. Each spectrum also is input to a trigger generator 20 for comparison with a frequency mask FM. Depending upon the results of the comparison, a frequency mask trigger is generated that causes the acquisition system 12 to store a block of digital data from the digital data stream surrounding the trigger event in a suitable storage device 22, such as a random access memory (RAM). The stored data may then be processed by a digital signal processor (DSP) 24, the results of which are provided to the display processor 16 for presentation on the display device 18.

FIG. 3 shows that according to the present invention a frequency mask may be replicated over a period of time so that a more complex frequency event may be defined. In this instance the requirement is that the carrier for the signal of interest remain within the limits of the specified frequency range for several time intervals. Any variation of the carrier signal outside those limits within the period of time defined by the frequency masks, or any other spurious frequency signals within that period of time, may violate the frequency masks to produce a trigger signal. Alternatively such a replicated frequency mask may be used to identify a signal that occurs at the particular frequency range for the specified period of time in order to generate a trigger signal because the signal does not change in frequency.

The primary concept of the present invention is to improve upon the triggering function of a spectrum analyzer to trigger on a user-defined mask on a spectrogram display. Such a trigger is either "positive" (analyzer samples until the changes in frequency exactly match a preset "trajectory" for the mask) or "negative" (changes in frequency violate the present trajectory). Therefore the analyzer may trigger on events where a carrier may be following an expected trajectory but unintended intermodulation or spurious responses during operation may cause mask violation. Such a mask as described herein may be used to trigger on a pre-defined serial event pattern like a particular sequence of frequency changes displayed by a "hopping" signal.

Figure 4:
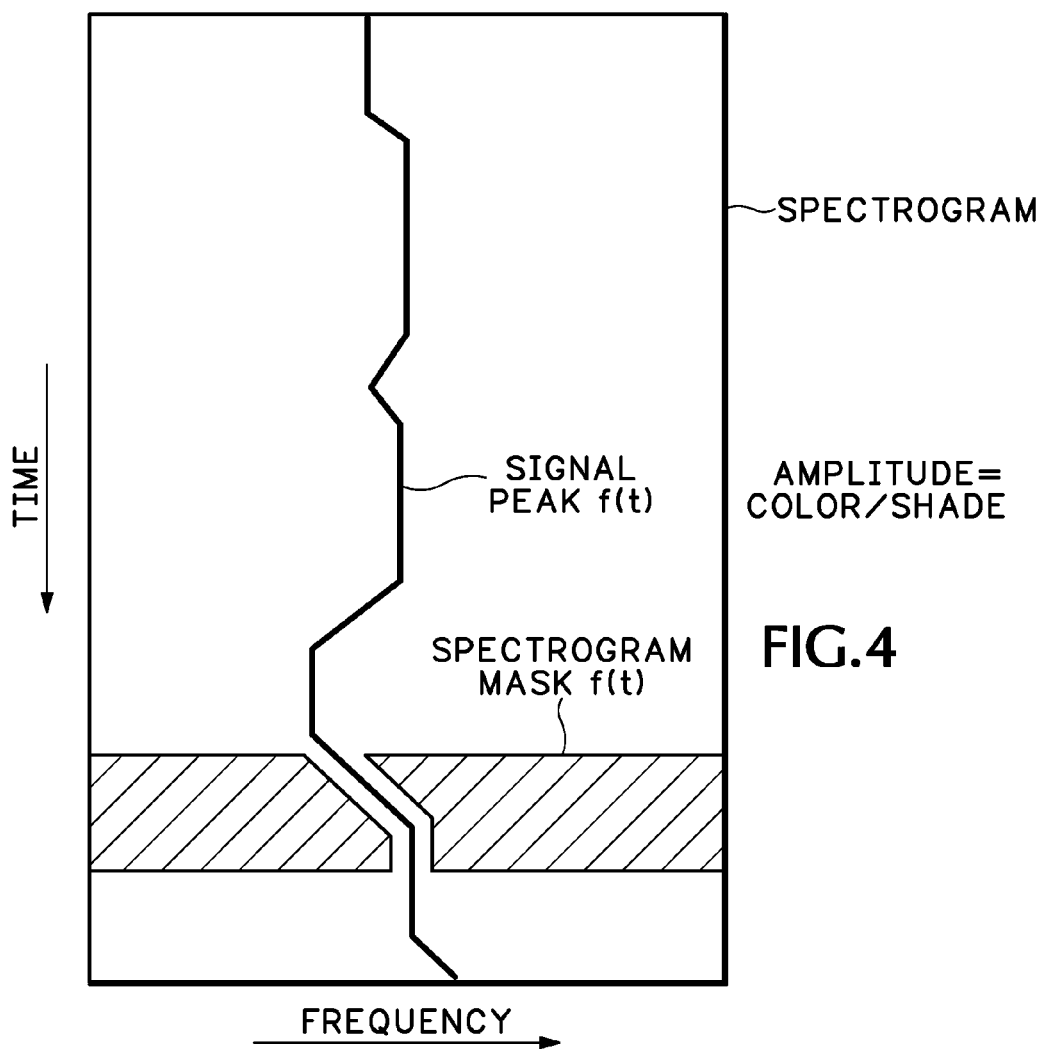
FIG. 4 is a graphic view of the replicated frequency masks translated into a spectrogram mask according to the present invention.
Figure 5:
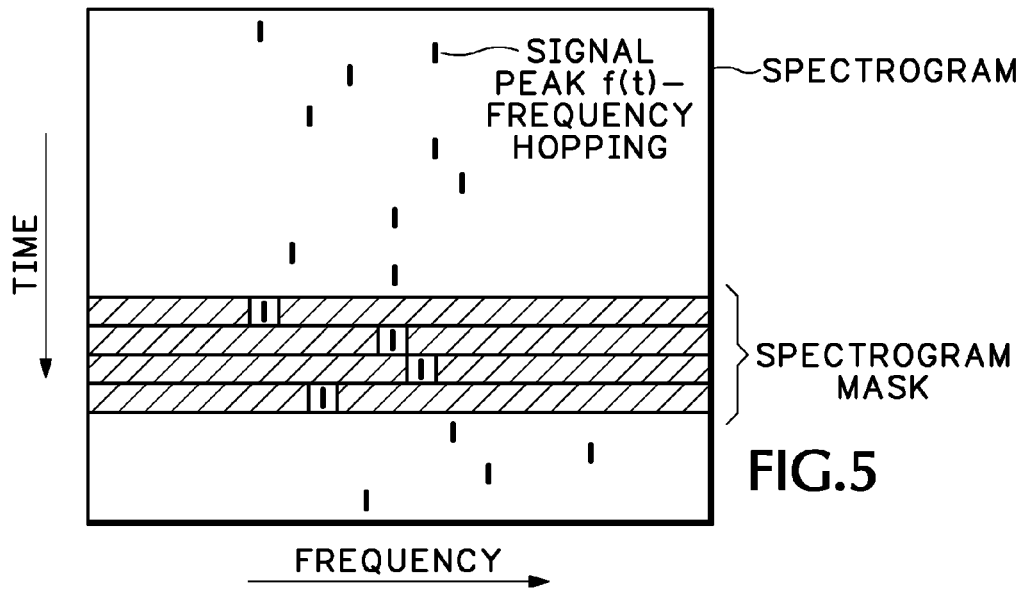
FIG. 5 is a graphic view of a spectrogram mask for generating a spectrogram mask trigger on a specific sequence of hops in a frequency hopping signal according to the present invention.

Implementation of a spectrogram frequency mask trigger requires definition of mask amplitude values, just like in the current frequency mask trigger applications. However such a mask is then turned "on edge" and replicated with the desired frequency offsets in time, as shown in FIG. 4, to create the spectrogram mask trigger. Further any one or number of individual frequency masks may be altered within the sequence that make up the spectrogram mask trigger to capture or gate specific events within the mask interval. An example of this is the expected spectral "splatter" at the beginning and end of a pulse caused by turn-on and turn-off transients in an amplifier. In this case the frequency masks may be altered at the beginning and end of the spectrogram mask period to allow for these excursions, but be held tighter during the body of the pulse where the spectrum is expected to be cleaner. FIG. 5 illustrates a spectrogram mask trigger for triggering on a specific sequence of hops in a frequency hopping signal.

Figure 6:
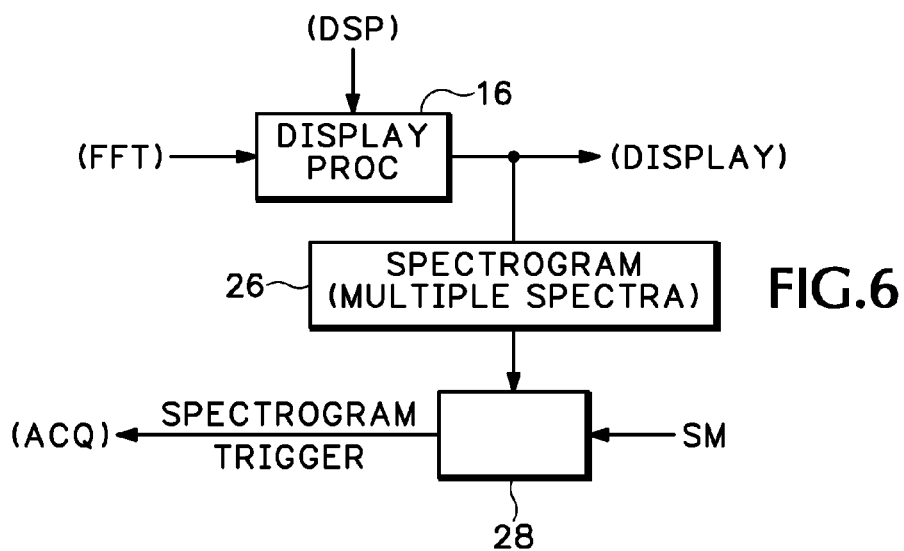
FIG. 6 is a partial basic block diagram of a realtime spectrum analyzer according to the present invention.

The spectrum analyzer shown in FIG. 2 may be modified as shown in FIG. 6 by having a spectrogram memory 26 coupled to the output of the display processor 16 to store multiple spectra from the input signal. A trigger generator 28 receives the multiple spectra from the spectrogram memory 26 and does a comparison with the spectrogram mask SM. Such a comparison could be made by comparing each spectrum in sequence with a corresponding frequency mask within the spectrogram mask and combining the results. A spectrogram mask trigger is generated by the trigger generator 28 when either each comparison indicates no violation or when one of the comparisons produces a violation, depending upon the particular frequency pattern for which the spectrogram mask is designed. Of course the spectrogram memory 26 is updated with each new signal spectrum—the oldest spectrum is removed and the new spectrum is added. The comparison with the spectrogram mask occurs after each update.

Thus the present invention provides a spectrogram mask trigger by defining a plurality of frequency masks over a specified period of time as a spectrogram mask so that multiple spectra of an input signal are examined for conformance or deviation from the spectrogram mask in order to generate the spectrogram mask trigger for acquiring data for storage and further processing.

What is claimed is:

1. An apparatus for generating a spectrogram mask trigger signal comprising:
    means for generating a spectrogram of an input signal having a plurality of spectra; and
    means for comparing the spectrogram with a spectrogram mask having a sequence of frequency masks over a specified time period to generate the spectrogram mask trigger signal when the spectrogram intersects with the spectrogram mask.

2. The apparatus as recited in claim 1 wherein the spectrogram mask comprises a sequence of frequency masks that define a specific sequence of frequency hops in a frequency hopping signal.

3. The apparatus as recited in claim 1 wherein the spectrogram mask comprises a sequence of frequency masks that provide for expected spectral splatter at the beginning and end of a pulse signal caused by turn-on and turn-off transients in an amplifier.

4. The apparatus as recited in claim 1 wherein the spectrogram mask comprises a sequence of frequency masks that define an expected frequency trajectory of a carrier in the input signal.

5. An apparatus for generating a spectrogram mask trigger signal comprising:
    means for generating a spectrogram of an input signal having a plurality of spectra; and
    means for comparing the spectrogram with a spectrogram mask having a sequence of frequency masks over a specified time period to generate the spectrogram mask trigger signal when the spectrogram does not intersect with the spectrogram mask.

6. The apparatus as recited in claim 5 wherein the spectrogram mask comprises a sequence of frequency masks that define a specific sequence of frequency hops in a frequency hopping signal.

7. The apparatus as recited in claim 5 wherein the spectrogram mask comprises a sequence of frequency masks that provide for expected spectral splatter at the beginning and end of a pulse signal caused by turn-on and turn-off transients in an amplifier.

8. The apparatus as recited in claim 5 wherein the spectrogram mask comprises a sequence of frequency masks that define an expected frequency trajectory of a carrier in the input signal.

* * * * *